(12) United States Patent
Besen et al.

(10) Patent No.: US 9,538,662 B2
(45) Date of Patent: Jan. 3, 2017

(54) 3D FLEX SOLDERING

(71) Applicant: Apple Inc., Cupertino, CA (US)

(72) Inventors: Richard A. Besen, New York, NY (US); Eric W. Bates, Sunnyvale, CA (US); Gregory N. Stephens, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/574,191

(22) Filed: Dec. 17, 2014

(65) Prior Publication Data

US 2016/0095204 A1    Mar. 31, 2016

Related U.S. Application Data

(63) Continuation of application No. PCT/US2014/070768, filed on Dec. 17, 2014.

(Continued)

(51) Int. Cl.
*H04M 1/00* (2006.01)
*H05K 1/18* (2006.01)
(Continued)

(52) U.S. Cl.
CPC ............. *H05K 1/189* (2013.01); *H01R 12/00* (2013.01); *H05K 3/3436* (2013.01);
(Continued)

(58) Field of Classification Search
CPC ................... H01Q 1/243; H05K 2201/10409; H05K 1/147; H05K 1/118; H05K 1/02; H05K 3/34; H05K 3/36; H05K 3/40; H05K 1/028; H05K 3/366; H05K 3/4007; H05K 3/361; H05K 1/0215; H05K 3/341; H05K 3/3447; H05K 3/363; G03B 15/03; G06F 1/1656; G06F 1/1626; H04M 1/0277; H04M 1/026; B32B 17/061; B41F 17/00; H01M 2/026; H01M 2/0292
(Continued)

(56) References Cited

U.S. PATENT DOCUMENTS 7,887,376 B1 * 2/2011 Zhang ................ H01R 13/6594
439/108
8,686,297 B2 * 4/2014 Shiu ........................ H05K 1/028
174/250

(Continued)

FOREIGN PATENT DOCUMENTS

JP        2007127629       5/2007
KR     1020090082971      8/2009

OTHER PUBLICATIONS

Three-Dimensional Flip-Chip on Flex Packaging for Power Electronics Applications, Xing sheng Liu, IEEE Transactions on Advanced Packaging, vol. 24, No. 1, Feb. 2001, pp. 1-9.*

(Continued)

*Primary Examiner* — Mahendra Patel
(74) *Attorney, Agent, or Firm* — Downey Brand LLP

(57) ABSTRACT

In some designs, getting a flexible circuit (flex) to assume a bent state can be helpful in efficiently routing electrically conductive pathways. One efficient way to implement soldering of flexes in a bent state during a reflow operation is to manipulate paneling that hold batches of the flexes to reliably maintain a suitable bend in those flexes. In some embodiments, a flex can be surface mounted to a portion or the whole of an electric device during a reflow operation during which the bent state is maintained by paneling that is at least partially attached to a periphery of the flex. Another solution is to utilize vacuum or hot glue fixtures to maintain a bend in the flex during surface mounting and reflow operations.

12 Claims, 11 Drawing Sheets

Related U.S. Application Data

(60) Provisional application No. 62/057,706, filed on Sep. 30, 2014.

(51) Int. Cl.
*H01R 12/00* (2006.01)
*H05K 3/34* (2006.01)

(52) U.S. Cl.
CPC . *H05K 3/3431* (2013.01); *H05K 2201/10189* (2013.01); *H05K 2201/10333* (2013.01); *H05K 2201/2036* (2013.01)

(58) Field of Classification Search
USPC ........................... 455/575.1, 379, 361
See application file for complete search history.

(56) References Cited

U.S. PATENT DOCUMENTS

| | | | |
|---|---|---|---|
| 8,837,141 B2 | 9/2014 | Clayton et al. | |
| 2007/0100253 A1 | 5/2007 | Sisk et al. | |
| 2008/0128860 A1* | 6/2008 | Sawada | H01G 4/232 257/536 |
| 2008/0157235 A1* | 7/2008 | Rogers | H01L 21/8258 257/415 |
| 2009/0242882 A1 | 10/2009 | Leung et al. | |
| 2009/0247237 A1* | 10/2009 | Mittleman | H04M 1/026 455/567 |
| 2009/0316351 A1* | 12/2009 | Zadesky | G06F 1/1626 361/679.33 |
| 2010/0006323 A1* | 1/2010 | Su | H05K 3/4691 174/254 |
| 2011/0081022 A1* | 4/2011 | Tamm | H01R 13/6594 381/1 |
| 2011/0255850 A1* | 10/2011 | Dinh | G03B 15/03 396/176 |
| 2012/0048589 A1 | 3/2012 | Jol | |
| 2013/0048347 A1* | 2/2013 | Shiu | H05K 1/028 174/254 |
| 2013/0078764 A1 | 3/2013 | Yamazaki et al. | |
| 2014/0154899 A1* | 6/2014 | Yang | H01R 12/79 439/77 |
| 2015/0295370 A1* | 10/2015 | Saari | H01R 24/58 439/669 |

OTHER PUBLICATIONS

Flip-Chip on Flex for 3D packaging, Ph. Clot, IEEE CPMT Int'l Electronic Manufacturing Technology Symposium, Apr. 1999, pp. 36-41.*

Integrated Flip-Chip Flex-Circuit Packaging for Power Electronics Applications, Ying Xiao, IEEE Transactions on Power Electronics, vol. 19, No. 2, Mar. 2004, pp. 515-522.*

PCT Application No. PCT/US2014/070768—International Search Report and Written Opinion dated Jun. 29, 2015.

* cited by examiner

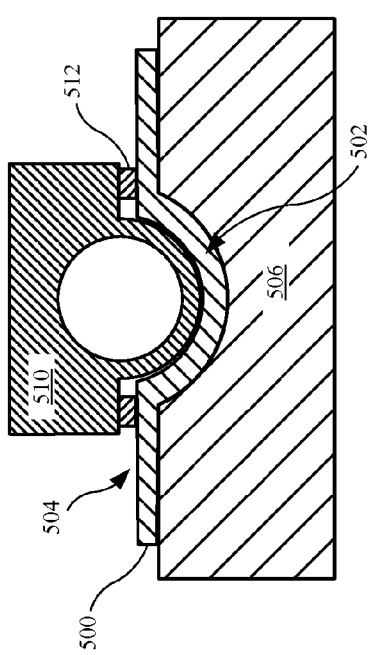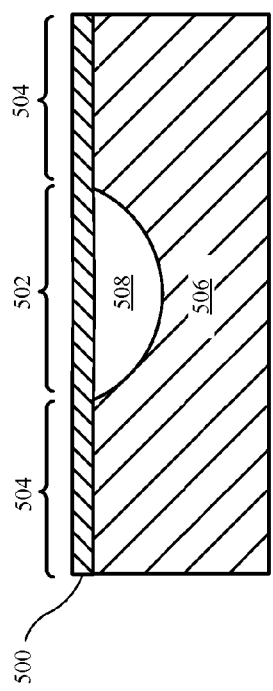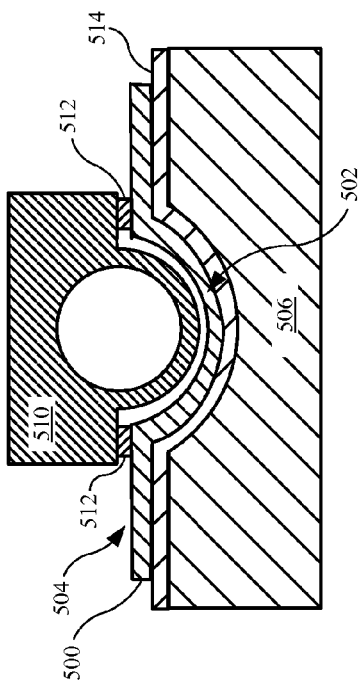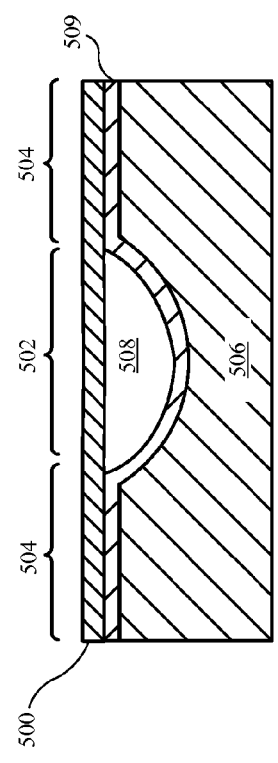
FIG. 5A
FIG. 5B
FIG. 5C
FIG. 5D

3D FLEX SOLDERING

CROSS REFERENCE TO RELATED APPLICATIONS

This is a continuation of International PCT Application No. PCT/US14/70768 filed Dec. 17, 2014, and claims priority to U.S. Provisional Application No. 62/057,706, filed Sep. 30, 2014 and entitled "3D FLEX SOLDERING", which is incorporated by reference herein in its entirety for all purposes.

FIELD

The described embodiments relate generally to a method of manufacturing an electronic device assembly that includes at least one flex circuit. More particularly, the present embodiments relate to techniques for soldering the flex circuit to an electronic component or components while the flex is in a bent state.

BACKGROUND

As mobile devices continue to get thinner and more features are added, design and packaging requirements become increasingly more difficult to achieve. For example, an amount of space available within a mobile device can decrease when a form factor of the mobile device is reduced. A flexible circuit (flex) can be utilized as a replacement for traditional wires and other connections in order to provide additional space efficiency as well as functionality. In some embodiments, design requirements may dictate that the flex bend around an obstruction. Current flex attachment methods when soldering the flex to various components involve: (1) positioning the components relative to the flex and applying solder paste between each of the components and the flex in a surface mounting step, and (2) heating the flex and the solder until the solder adheres and forms around the electrical connections between the flex and the components in a reflow step. However, conventional manufacturing guidelines dictate the flex remains flat during the entire attachment process. Bending or folding of the flex prior to conducting surface mounting and reflow steps is avoided because, stresses resulting from the bending may cause flattening of the flex and adverse shifting of the components.

SUMMARY

This paper describes various embodiments that relate to an electronic device assembly apparatus and method for producing an electronic device assembly. More specifically, the electronic device assembly includes a flexible circuit following a particular geometry of an electronic component.

A manufacturing method is disclosed. The manufacturing method includes at least the following steps: removing a portion of a carrier attached to a flexible circuit so that a first end of the carrier is separated from a second end of the carrier, the first and second ends of the carrier attached to first and second ends of the flexible circuit; coupling the first end of the carrier to the second end of the carrier; forming an electrical connection between a first portion of the flexible circuit and a first conductive pad and between a second portion of the flexible circuit and a second conductive pad. Coupling the first end and the second end of the carrier together shortens a length of the carrier, which causes a central portion of the flexible circuit to bend. The bend in the central portion of the flexible circuit can accommodate a protruding portion of an electrical component positioned between the first and second conductive pads.

Another manufacturing method is disclosed. The other manufacturing method includes the steps of creating a bend in a flexible circuit by manipulating separated portions of a carrier configured to support the flex, the separated portions of the carrier attached to opposing ends of the flexible circuit; maintaining the bend in the flexible circuit by coupling the separated portions of the carrier together; surface mounting a number of components to the flexible circuit; performing a reflow operation on the flexible circuit, the carrier maintaining the bend in the flexible circuit during the reflow operation; and separating the flexible circuit from the separated portions of the carrier.

Finally, an apparatus is disclosed. The apparatus includes a flexible circuit with a central region. The flexible circuit can be attached to a carrier. In some embodiments, the flexible circuit is joined to the carrier along a periphery of the flexible circuit. The carrier can include a removable portion attached to the central region of the flexible circuit. The removable portion can be located between a first and second end of the carrier. The interface between the carrier and the flexible circuit can include a number of indicia that are configured to facilitate separation between the removable portion and the carrier by identifying a location of the interface between the removable portion and the ends of the carrier. A length of the carrier is shortened when the removable portion is removed and the first end and the second end are fastened together, thereby creating a bend in the central region of the flexible circuit.

An electronic device assembly is disclosed. The electronic device assembly can include an electronic component having a protruding curved surface located between a first lead and a second lead of the electronic component. A flex can electrically couple the first lead and the second lead on the electronic component. The flex can be soldered to the first lead at one end of the flex and also soldered to the second lead at a second end of the flex. A central portion of the flex can be bent to accommodate the protruding curved surface of the electronic device.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

FIGS. 5A-5B show cross-sectional views of another illustrative manufacturing method by which a bent flex can be created and assembled with an electronic component by utilizing a vacuum fixture;

FIGS. 5C-5D show cross-sectional views of another illustrative manufacturing method by which a bent flex can be created and assembled with an electronic component by utilizing a hot glue fixture.

DETAILED DESCRIPTION

Figure 1A:
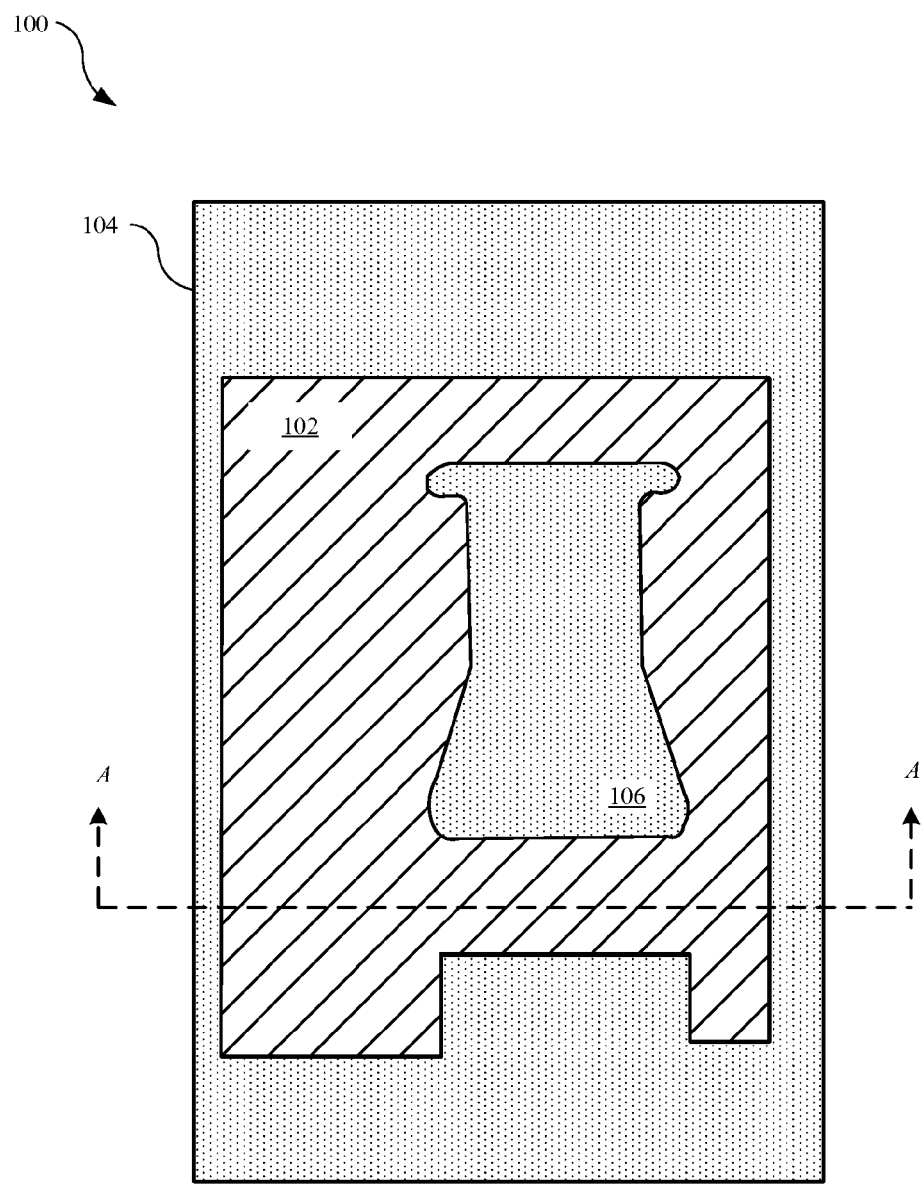
FIGS. 1A-1D show top views of an illustrative manufacturing method by which a flex can maintain a bent state during a surface mounting operation and a reflow operation.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A flexible circuit ("flex") is an electronic circuit printed on a flexible polymer substrate often utilized as a connector cable in applications where flexibility, space savings, or other production constraints prevent traditional connectors, such as wires from being utilized. The flex can include a number of electrically conductive pathways that can take the form of leads and traces. In some embodiments, the flex can act solely as a flexible pathway for routing signals, while in other embodiments, one or more electrical components can be surface mounted to the flex at various attachment points. In some embodiments, the attachment points can take the form of electrically conductive leads. The electrical components can be surface mounted to the flex by (1) placing the electrical components in position upon the flex and applying solder paste beneath each of the electrical components in a surface mounting step, and (2) heating the flex and the solder until the solder adheres and forms around the electrical connections in a reflow step. While flexes have increased design efficiencies, traditional flex attachment methods can limit the utility of the flex. For example, an obstacle such as a protruding electrical component or feature can be positioned between two solder pads. Surface mounting a flex to contacts on each of the two pads without routing the flex all the way around the protruding feature would require a portion of the flex to maintain a bent state during the surface mounting to accommodate the protruding component. Plastic deformation due to the bending of the flex can result in an amount of residual force being stored in the flex that biases the flex back towards a flat geometry. Consequently, unless pressure is maintained on each end of the flex, the flex will bend back into a substantially flat state. For this reason, traditional automated assembly line manufacturing processes can be unsuccessful as the residual forces can prevent the ends of the bent flex from being maintained in place during surface mounting and reflow operations.

Flexes are commonly mass-produced from a sheet, a rolled up sheet, or a stack of sheets that are large enough to accommodate multiple flexes. Instead of separating each of the flexes from the sheet when the flexes are completed, many manufacturers when delivering large numbers of flexes deliver the flexes without first removing the flexes from the sheet. The sheet is often referred to as a carrier or paneling. In some embodiments, an interface between the paneling and each flex can be limited to small segments of material that join peripheral edges of each flex to the paneling, thereby making the flex easy to remove from the paneling. In some embodiments, the paneling can include extra reinforcement that makes it more rigid than the flexes it supports.

One solution to the aforementioned problem of maintaining a bend in the flex during surface mounting and reflow operations, involves a technique in which the paneling is used to maintain the bend in the flex. This solution involves removing a central portion of the paneling that surrounds a central region of a flex. Removing the portion of the paneling surrounding the central region of the flex separates a first portion of the paneling attached to a first end of the flex from a second portion of the paneling attached to a second end of the flex. Subsequent to removing the central portion of the paneling, the first and second portions of the paneling can be moved toward each other until the central region of the flex assumes a bent geometry having a desired size and shape. The first and second portions of the paneling can then be coupled together so the bent geometry can be maintained. The first and second portions can be coupled together by for example high temperature Kapton® (a polyimide substrate) tape or in some embodiments by an extra piece of flex material and glue. Suitable materials for joining the paneling together should be able to maintain the coupling throughout a reflow operation. In some embodiments, removing the central portion of the paneling creates a gap between the first and second portions of the paneling that allows the central region of the flex to define a bent geometry having a predetermined size and shape when the first and second portions of the paneling are brought into abutting contact. Because the paneling leaves both surfaces of the flex exposed, surface mount components can be mounted to both surfaces of the flex. In some embodiments, this configuration can allow surface mounted components to be attached to a first surface of the flex and for a second surface of the flex to be surface mounted to the electrical component that includes a protruding feature. Subsequent to reflow and solidification of the solder, the paneling can be completely cut away from the flex, leaving the flex joined to the electrical component and bypassing the protruding feature. It should be noted that in some embodiments, portions of the paneling that would interfere with the protruding feature of the electrical component can also be cut away prior to conducting surface mounting and reflow operations.

In some embodiments, a flex can be surface mounted to modular connectors that include circuitry of an audio jack that connects to the audio jack in a position that places the modular connectors adjacent to a barrel portion of the audio jack. In some embodiments, the flex can be laid out flat on a vacuum fixture that includes a channel in the shape of a desired curve or bend of the flex. When the flex is suctioned to the vacuum fixture a portion of the flex can be secured within and conform with the channel defined by the vacuum fixture. In some embodiments, high temperature adhesive can be used in lieu of or in addition to suction to keep the flex in position upon a fixture. Once the flex is attached to the fixture, solder paste and the electrical component can be placed atop the flex, which can then go through a reflow operation, allowing components to be attached to both surfaces of the flex in a single reflow operation.

These and other embodiments are discussed below with reference to FIGS. 1A-6; however, those skilled in the art will readily appreciate that the detailed description given herein with respect to these figures is for explanatory purposes only and should not be construed as limiting.

Figure 1B:
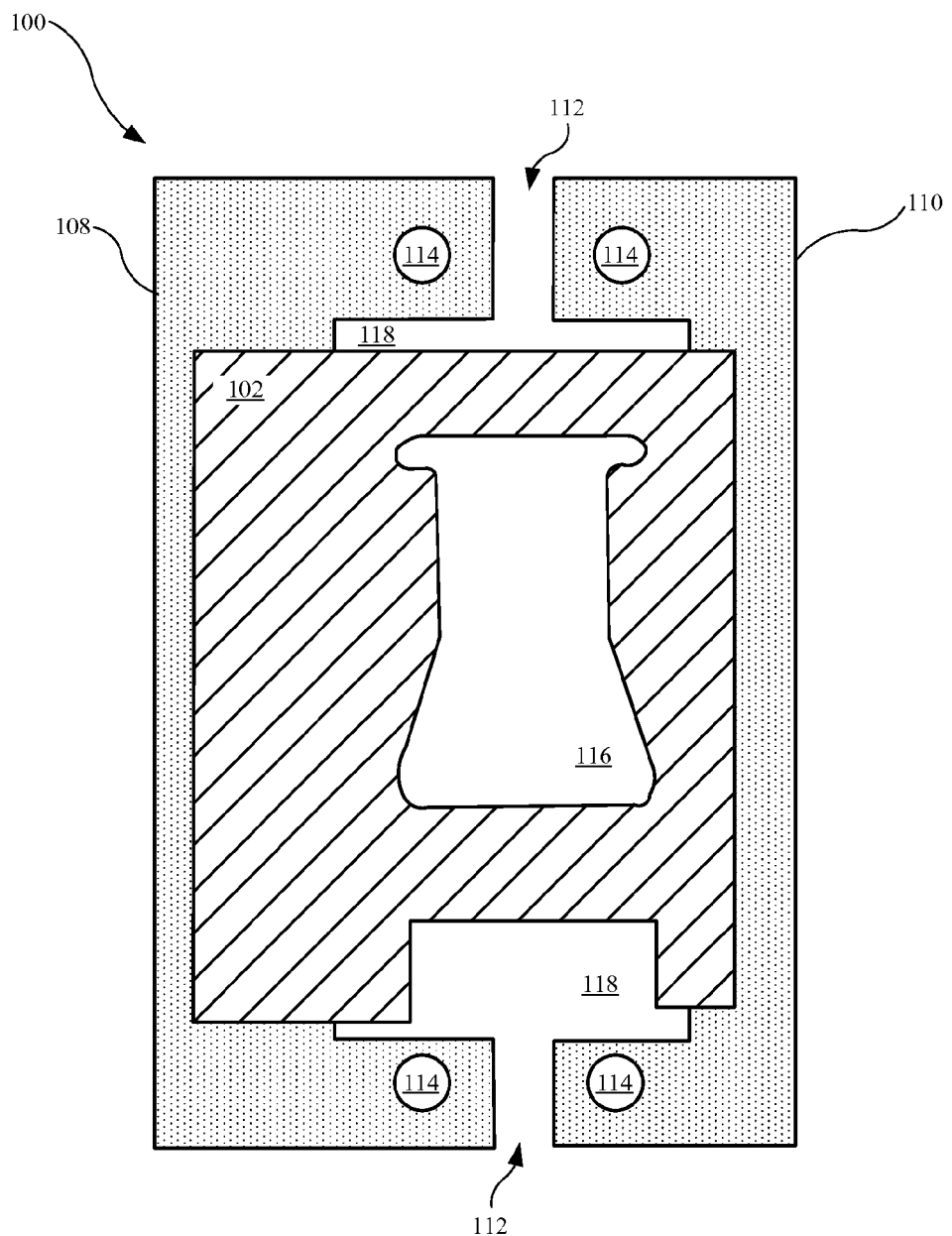
Figure 1C:
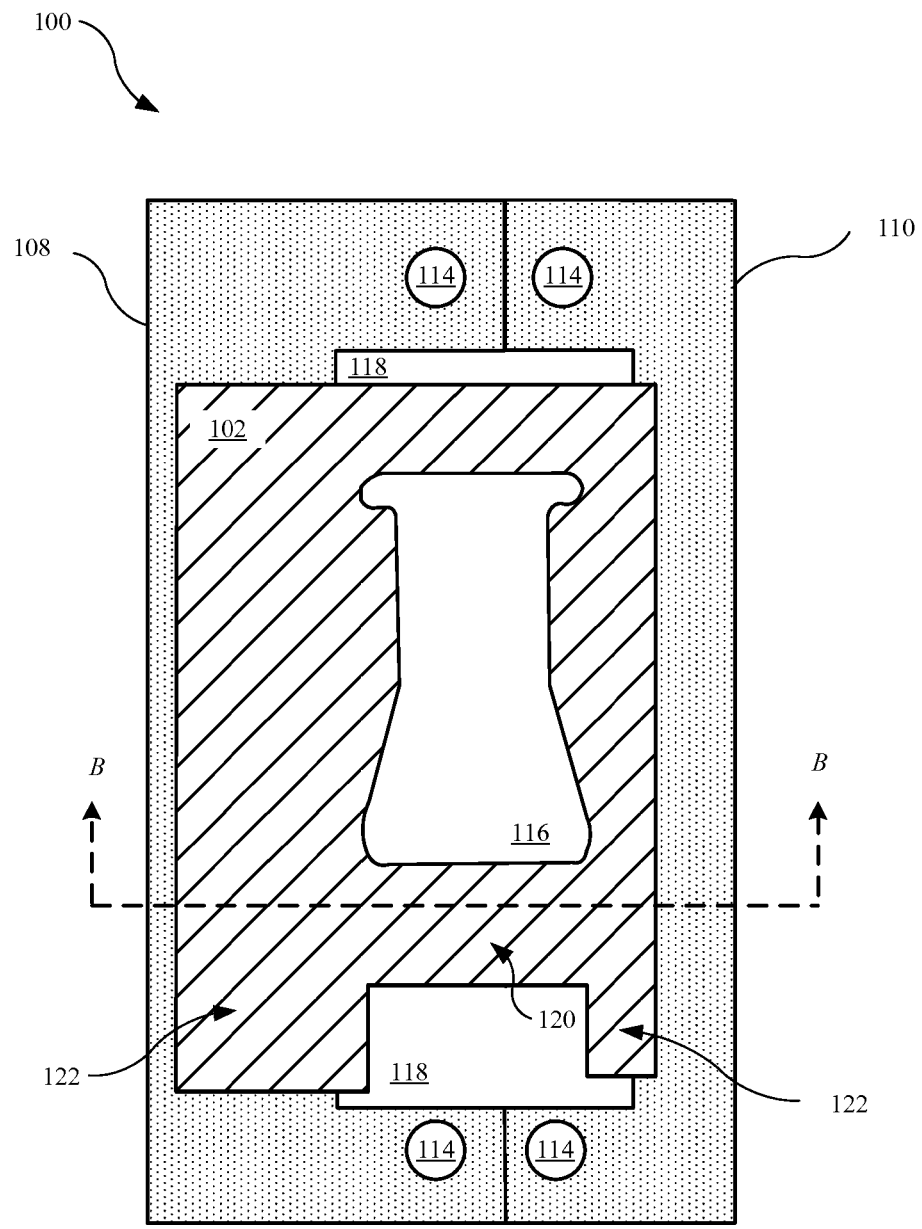

FIGS. 1A-1C show an illustrative method of creating a bend in flex 102 by manipulating paneling 104 so that the bend can be maintained during surface mounting and reflow operations. FIG. 1A depicts flex 102 secured to paneling 104. Paneling 104 can be formed from a rigid, heat-resistant material. In some embodiments paneling 104 can be formed from the same material as at least a portion of flex 102. The rigid material can include for example, laminates, copper-clad laminates, and pre-impregnated composite fibers. Flex 102 is a flexible circuit that is ordinarily designed to be removed from paneling 104 by cutting through narrow connections extending between a peripheral edge of flex 102 and an edge of paneling 104; however, in this embodiment, only some of the narrow connections between paneling 104 and flex 102 are removed. Paneling 104 can also include portion 106 that occupies an opening defined by flex 102. Removal of portions of paneling 104 from flex 102 can be accomplished by die cutting, laser cutting, milling, or other mechanical cutting operations. In some embodiments, the opening in flex 102 covered by portion 106 can be utilized to reduce an amount of stress generating when bending flex 102. In some embodiments, the opening occupied by portion 106 can be configured to accommodate a protruding feature positioned proximate to a location upon which flex 102 is configured to be mounted.

FIG. 1B depicts the results of applying a cutting process to partially disconnect flex 102 from paneling 104. The cutting process for partially disconnecting flex 102 from paneling 104 can split paneling 104 into first portion 108 and second portion 110 so that relative motion between first portion 108 and second portion 110 is restricted only by flex 102. In this way, flex 102 can bend and flex to accommodate relative motion between first and second portions 108 and 110. The cutting process leaves gap zones 112, locator holes 114, flex opening 116, and cutouts 118. Gap zones 112 can be sized to accommodate movement of first portion 108 towards second portions 110. In some embodiments, gap zone 112 can have a width of about half a millimeter. A distance between first and second portions 108 and 110 defined by gap zone 112 can be commensurate with an amount of bend desired in flex 102. Locator holes 114 can assist automated machinery in determining a position and orientation of first and second portions 108 and 110. For example, in some embodiments, the automated machinery can be configured to maneuver first and second portions 108 and 110 so that locator holes 114 overlap one another. Flex opening 116 can reduce an amount of stress generated when bending a central portion of flex 102. Flex opening 116 can also accommodate protruding features having a size that exceeds the room provided by the curvature of flex 102. FIG. 1B depicts how additional portions of paneling 104 have been removed to form cutouts 118, which can release a central region of flex 102 from paneling 104. By freeing the central region of paneling 104 a length over which paneling 104 bends can be clearly defined. In this way, the released central region of flex 102 is left free to bend. In addition to defining an amount of flex 102 that can be bent, cutouts 118 can also be configured to create space for portions of an electrical component that would otherwise interfere with mounting flex 102 to the electrical component.

FIG. 1C shows a top view of flex 102 in a bent state, the bent state achieved by bringing first and second portions 108 and 110 together to form bend 120 and wings 122. Bend 120 being the portion of flex 102 that defines the bend and wings 122 being the portions of flex 102 that remain substantially flat. It should be noted that while first and second portions 108 and 110 are shown in abutting contact, other configurations are also possible. For example, in some embodiments, gap zones 112 are only shortened, leaving a distance between first portions 108 and second portion 110 and in other embodiments, first and second portions 108 and 110 partially overlap one another. Similarly, first and second portions 108 and 110 can be brought together in various ways. In some embodiments, first portion 108 can be held in place while second portion 110 is pushed towards first portion 108. In some embodiments, second portion 110 can be held in place while first portion 108 is pushed towards second portion 110. In other embodiments, first portion 108 and second portion 110 of paneling 104 may be simultaneously pushed together in order to close or reduce gap zones 112. In some embodiments, locator holes 114 can be utilized to align protruding ends of first and second portions 108 and 110 so that no twist is introduced in flex 102 during the motion. In some embodiments, bend 120 can assume a bent geometry that follows an external curvature of a barrel portion of an audio jack. Once brought together, first portion 108 and second portion 110 can be secured to each other utilizing Kapton® tape, high-temperature adhesive, or interlocking features of first portion 108 second portion 110. Once bend 120 has been formed and first and second portions 108 and 110 have been securely fixed together, flex 102 can undergo surface mounting and reflow steps while the first and second portions 108 and 110 maintain a geometry of bend 120 in order to surface mount various electrical components, such as the audio jack. In some embodiments, the width and length of cutout 118 can allow various features of the electrical components to pass through cutout 118, thereby preventing first and second portions 108 and 110 from interfering with positioning flex 102 atop the electrical component prior to the surface mounting and reflow steps.

Figure 1D:
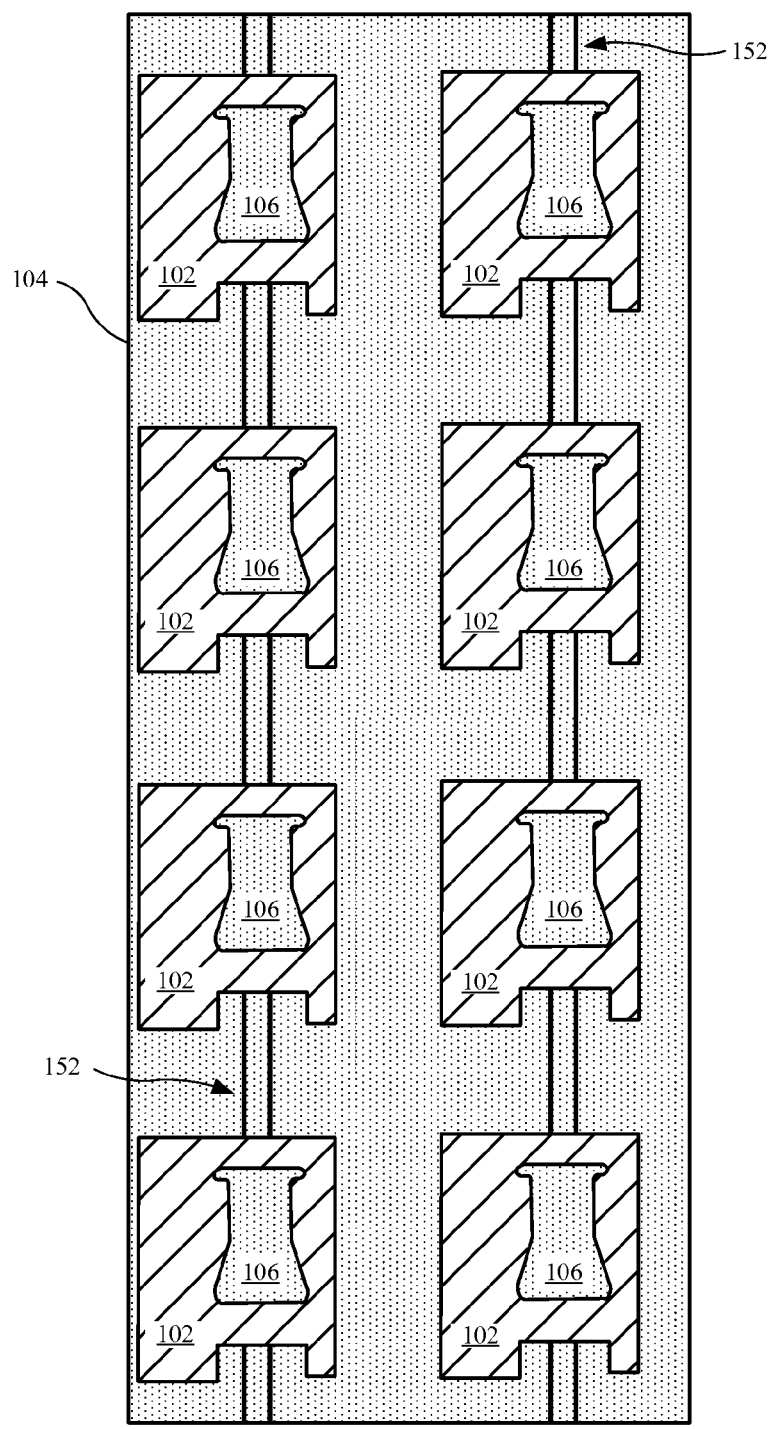

FIG. 1D shows a number of flexes 102 attached to paneling 104 in a grid pattern in which various ones of flexes 102 are in vertical or horizontal alignment. In some embodiments, paneling 104 can be formed from a rigid material configured to maintain flexes 102 in a substantially flat state. In some embodiments, flexes 102 can be arranged in a pattern limited to one or more columns and rows. Portions of paneling 104 can be removed by a cutting process applied along indicia 152 in order to form gap zones 112 to facilitate forming bends in each of flexes 102. Removal of material from between indicia 152 allows bending to be concurrently applied to each flex 102 attached to paneling 104. For example, by moving outbound separated portions of paneling 104 towards the central portion of paneling 104, bending can be applied to eight flexes 102 in a single step. In some embodiments, indicia 152 can be markings identifiable by a computer vision system so that cuts made by a computer controlled manufacturing apparatus can cut precisely along indicia 152, thereby separating a central portion of paneling 104 so that opposing sides of paneling 104 can be separated and subsequently manipulated. In this way, indicia 152 can help to define an amount of material removed from paneling 104 so that a bend formed in each of the flexes is maintained at a consistent size and shape. In some embodiments, indicia 152 can be embodied as perforations. A technician can selectively separate flex 102 from paneling 104 by applying a force along an interface between each flex 102 and paneling 104 in accordance with indicia 152 when the indicia are embodied as perforations. In some embodiments, paneling 104 can be referred to as a carrier. Other portions of paneling 104 can be removed from around each flex 102 in a similar manner as described with FIGS. 1A-1C.

Figure 2A:
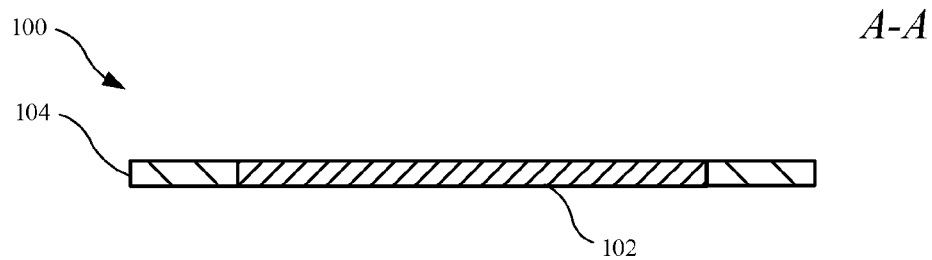
FIGS. 2A-2C show cross-sectional views of the illustrative manufacturing method depicted in FIGS. 1A-1C.
Figure 2B:
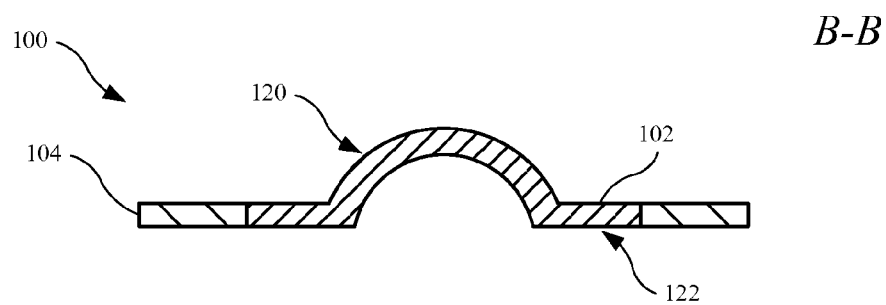
Figure 2C:
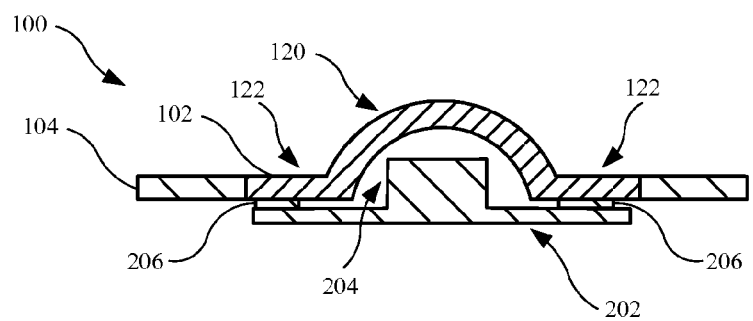

FIGS. 2A-2C show simplified cross-sectional views of FIGS. 1A-1C depicting a method for bending a flex. FIG. 2A shows a cross-sectional view of paneling 104 and flex 102 in accordance with section line A-A of FIG. 1A. Flex 102 is depicted in a substantially flat state within paneling 104. FIG. 2B shows a cross-sectional view of flex 102 and paneling 104 in accordance with section line B-B. After undergoing a cutting operation, flex 102 is attached to paneling 104 only at wings 122. Kapton® tape or high temperature adhesive can be utilized to fix a geometry of bend 120 once the remaining portions of paneling 104 are pushed together by securing the remaining portions of paneling 104 together. In this way, a residual force stored in flex 102 can be prevented from biasing flex 102 back into a flat geometry. In some embodiments, paneling 104 can include interlocking features that allow it to be attached to itself to maintain bend 120 after a central portion of paneling 104 is removed. FIG. 2C depicts the final step of attaching flex 102 to electrical component 202. Electrical component can include protruding feature 204 located between contact points 206. Bend 120 on flex 102 can curve around protruding feature 204 allowing flat portions of flex 102 to be soldered to contact points 206. In some embodiments, electrical component 202 can have multiple protruding features, which can be accommodated by one or more flexes 102. In some embodiments, contact points 206 can be solder pads electrically coupled with circuitry of electrical component 202. Electrical component 202 can be surface mounted to flex 102 during surface mounting and reflow operations. In some embodiments, the heat involved in reflow can reduce an amount of stress in flex 102 due to bend 120, thereby reducing an amount of residual stress applied to the connections formed at contact points 206. After undergoing the surface mounting and reflow steps, both ends of flex 102 are now electrically and mechanically attached to electrical component 202, and consequently flex 102 can be mechanically separated from paneling 104 without releasing bend 120 from flex 102.

Figure 3A:
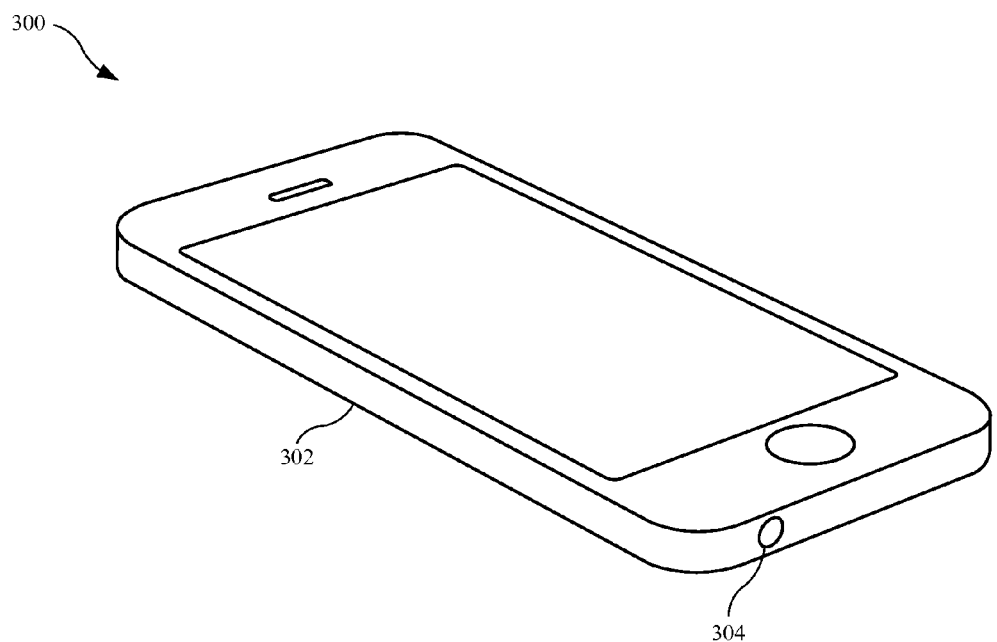
FIGS. 3A-3B show a number of views of an illustrative electronic device suitable for use with the described embodiments.
Figure 3B:
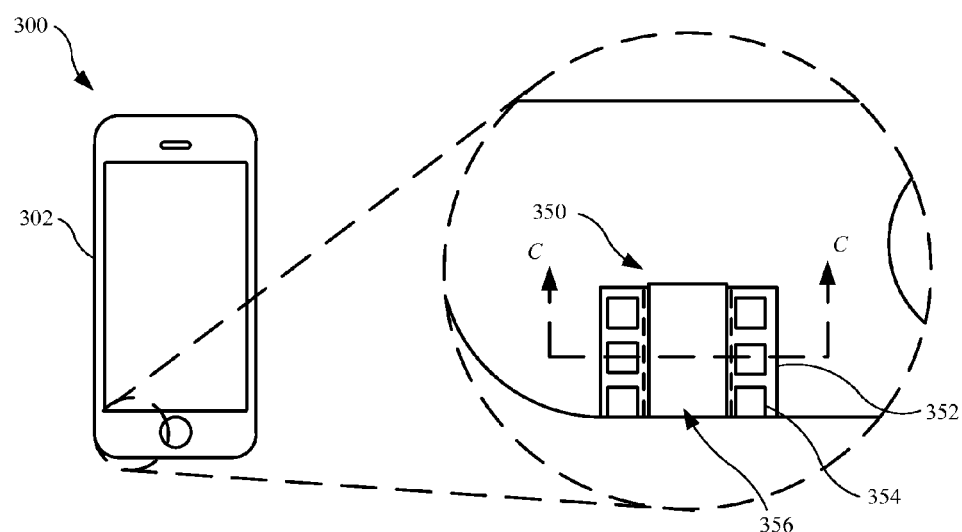

FIGS. 3A-3B show a mobile device suitable for use with the previously described embodiments. In some embodiments, mobile device 300 can be a mobile telephony device along the lines of a mobile telephone. FIG. 3A shows how mobile device 300 can include housing 302 made up of a number of integrally formed walls that cooperate to create an internal volume within which electrical components can be positioned and protected. The electronic components can include circuitry for supporting audio output functionality. Housing 302 can also take the form of multiple housing components that cooperate to define the internal volume for positioning and protecting the electronic components. Housing 302 can also include an opening, which can take the form of opening 304 for receiving an audio cable. FIG. 3B shows a top view of mobile device 300 and a close up cutaway view of audio jack assembly 350. Audio jack assembly 350 can include flex 352 having surface mounted components 354 attached. Flex 352 can include bend 356 defined by flex 352 that accommodates a protruding feature (not depicted) of audio jack assembly 350.

Figure 3C:
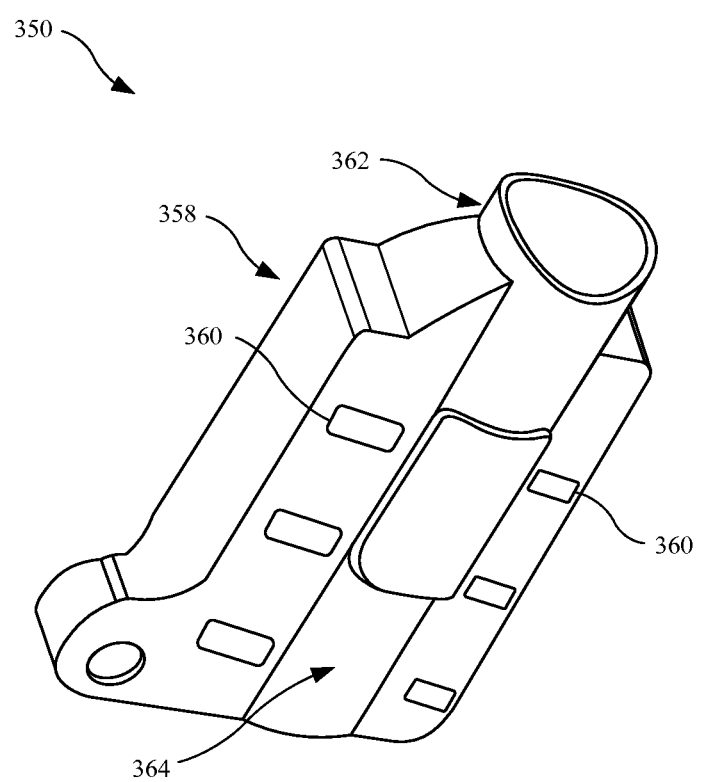
FIG. 3C shows a perspective view of an electrical component taking the form of an audio jack assembly suitable for use with the described embodiments.

FIG. 3C shows a perspective view of audio jack assembly 350 pictured without flex 352 attached. Audio jack assembly 350 can include audio jack 358. Audio jack 358 can include attachment points 360. In some embodiments, attachment points 360 may need to be electrically coupled together in order for audio jack assembly 350 to provide audio functionality. In some embodiments, attachment points 360 can be solder pads. In some embodiments, minimizing a length of the electrical connections between attachment points 360 can be desirable. For example, audio jack assembly 350 may provide superior audio functionality when a length of electrically conductive pathways joining attachment points 360 is minimized. Audio jack 358 can also include a protruding feature taking the form of barrel 362 that accepts a male end of an audio cable. Barrel 362 can include curved surface 364. Connecting attachment points 360 in the shortest distance possible can require a flex with a bend such as flex 352 (not shown) in order to electrically couple attachment points (solder pads) 360 disposed upon opposite sides of barrel 362.

Figure 3D:
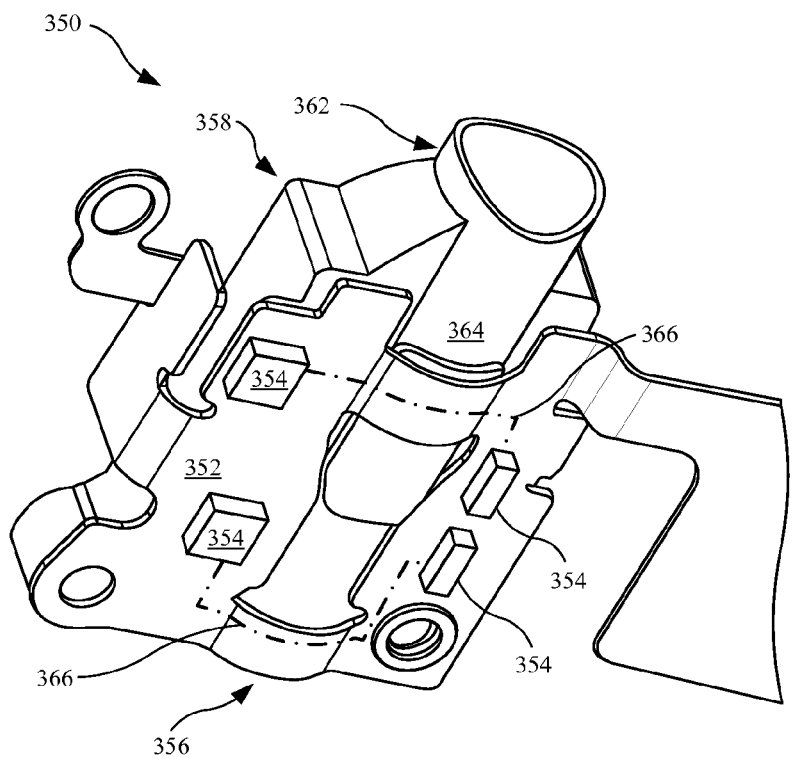
FIG. 3D shows a perspective view of the audio jack assembly with a flex attached to the audio jack assembly.

FIG. 3D shows flex 352 electrically coupled to a number of surface mounted components 354. Flex 352 can include traces 366 for electrically connecting surface mounted components 354 to each other. Surface mounted components 354 can be attached to flex 352 via surface mounting and reflow steps. Flex 352 can include various geometries for minimizing an amount of volume taken up by audio jack assembly 350. In some embodiments, bend 356 of flex 352 conforms to curved surface 364 of barrel 362 of audio jack 358. In other embodiments, traces 366 can be routed across bend 356 can provide the shortest path to connect surface mounted components 354 to each other.

Figure 3E:
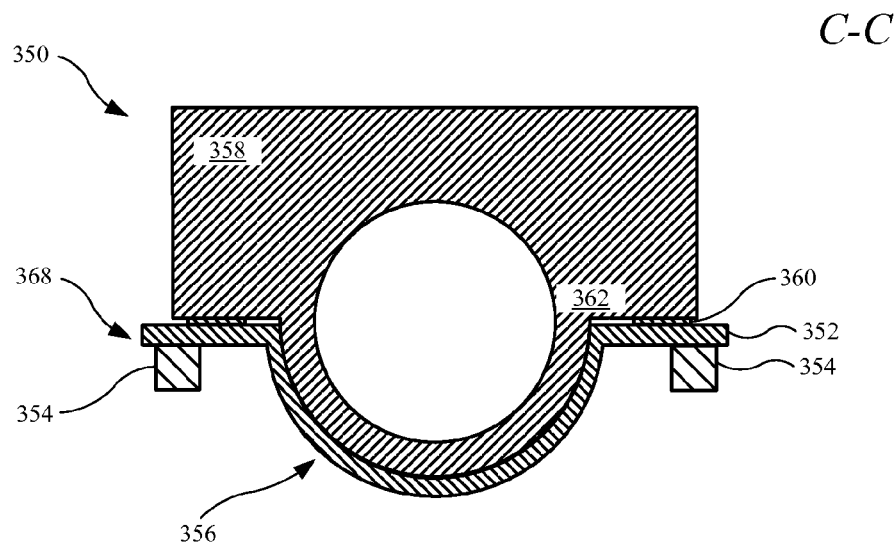
FIG. 3E shows a cross-sectional view of the audio jack assembly.

FIG. 3E shows a cross-sectional view of audio jack assembly 350 in accordance with section line C-C of FIG. 3B. Flex 352 can include bend 356 and relatively flat wings 368. Audio jack 358 can include attachment points 360 for attaching a substantially flat surface such as wings 368 of flex 352 to audio jack 358. In some embodiments, flex 352 can electrically connect one attachment point 360 to another attachment point 360. Soldering of flex 352 to attachment points 360 also provide a mechanical connection between audio jack 358 and flex 352. Attachment points 360 can be contacts or solder points. The mechanical and physical connections can be provided by a solder such as a solder paste. Bend 356 in flex 352 allows flex 352 to curve around barrel 362 of audio jack 358. In some embodiments, bend 356 of flex 352 remains in physical contact with audio jack 358. In other embodiments, there can be space between flex 352 and audio jack 358 at bend 356.

Figure 4A:
FIGS. 4A-4C show cross-sectional views of another illustrative manufacturing method by which a bent flex can be created and assembled with an electronic component by utilizing a modular electrical component.
Figure 4B:
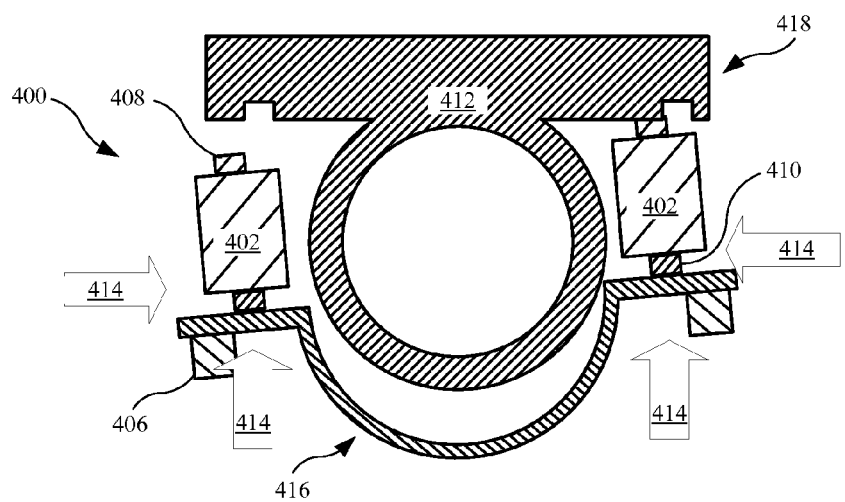
Figure 4C:
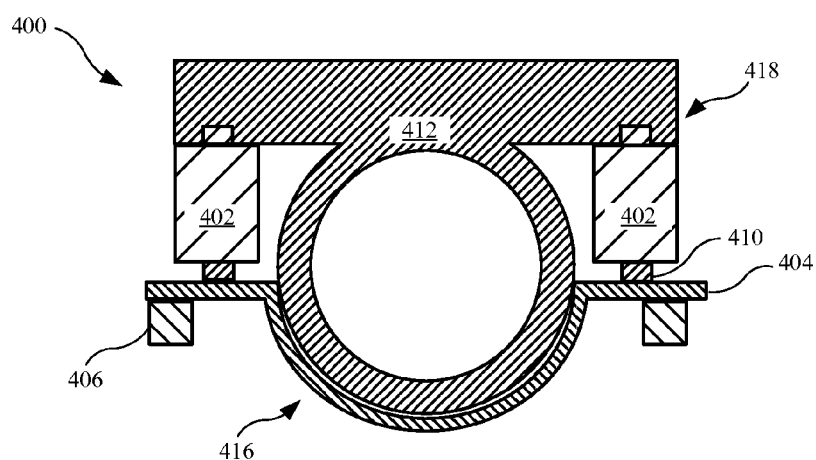

FIGS. 4A-4C depict a method of attaching a component to a flex in a flat state and then forming a bend on the flex and attaching the flex to an electrical component with two of the attached components. FIG. 4A shows audio jack assembly 400. In this embodiment, operational circuitry of audio jack assembly 400 can be integrated into each one of modular connector components 402. For example, some of the operational circuitry can interact with circuitry of other components of the audio jack assembly to perform an audio output function. Modular connector components 402 can be soldered to flex 404. Flex 404 can also include surface mount components 406 attached to a surface of flex 404 opposite modular connector components 402. In some embodiments, flex 404 can maintain a substantially flat state during the surface mounting operation. Modular connector components 402 can include interlocking features 408 to facilitate joining with another part of audio jack assembly 400. In some embodiments, interlocking features 408 can take the form of pins that electrically couple with the other portions of audio jack assembly 400 such as a number of channels or sockets configured to accept the pins. Modular connector components 402 can utilize attachment points 410 for attachment to flex 404. Attachment points 410 can take the form of solder pads.

FIG. 4B shows modular connector components 402 being attached to support structure 418 of audio jack assembly 400. In addition to modular connector components 402, audio jack assembly 400 can include an electrical component with a protrusion with a curved surface such as audio jack barrel 412. A technician or machine can apply forces 414 to various components of audio jack assembly 400. Forces 414 can cooperate to form bend 416 in flex 404 to follow the curved surface of audio jack barrel 412. Forces 414 can also bring modular connector components 402 to mate with audio jack barrel 412. Support structure 418 can be integrally formed with audio jack barrel 412 and can mate with interlocking features 408 of modular connector components 402. Support structure 418 can also electrically couple modular connector components 402 with audio jack barrel 412. Support structure 418 can also be mechanically strong enough to resist the tendency of flex 404 to return to a substantially flat state. FIG. 4C shows flex 404 coupled with audio jack barrel 412 by way of modular connector components 402 to form audio jack assembly 400. Audio jack barrel 412 can line up coaxially with bend 416. Flex 404 can contact audio jack barrel 412 at bend 416 or there may be substantial tolerance between flex 404 and audio jack barrel 412.

FIGS. 5A-5B depict another method of forming a bend in flex 500 and then attaching flex 500 to an electrical component. The method can be utilized on flex 500 to form bend 502 and wings 504. Flex 500 can start out as a substantially flat piece as depicted in FIG. 5A. Flex 500 can be laid out onto fixture 506. In some embodiments, fixture 506 can be a vacuum fixture. Flex 500 can be fixed to fixture 506 at wings 504. In other embodiments, flex 500 can be secured by a vacuum force created by fixture 506 at the interface between wings 504 and fixture 506. Fixture 506 can include a channel, which can take the form of gap zone 508. Gap zone 508 can be formed to create bend 502 when suction is applied to flex 500 by fixture 506. In some embodiments, gap zone 508 can have a width of about half a millimeter. Audio jack 510 can be attached to flex 500 via attachment points 512. In some embodiments, attachment points 512 can be solder points and audio jack 510 can be attached to flex 500 by utilizing surface mounting and reflow operations. Bend 502 can also be set by the surface mounting and reflow steps. After undergoing the surface mounting and reflow steps, flex 500 can be mechanically separated from fixture 506. In some embodiments, attachment points 512 can provide both electrical and mechanical connections between audio jack 510 and flex 500.

FIGS. 5C-5D depict another method of forming a bend on a flex and then attaching the flex to an electrical component. The method can be utilized on flex 500 to form bend 502 and wings 504. Flex 500 can start out as a substantially flat piece as depicted in FIG. 5C. Flex 500 can be laid out onto fixture 506. In some embodiments, fixture 506 can be a hot glue fixture. Flex 500 can be adhesively coupled to fixture 506 at wings 504 by high temperature resistant glue. Fixture 506 can include a channel, which can take the form of gap zone 508. Gap zone 508 can be formed to define bend 502 as hot glue layer 514 fixes bend 502 in position within gap zone 508. In some embodiments, gap zone 508 can have a width of about half a millimeter. Audio jack 510 can be attached to wings 504 via attachment points 512. In some embodiments, attachment points 512 can be solder points and audio jack 510 can be attached to flex 500 by utilizing surface mounting and reflow steps. After undergoing the surface mounting and reflow steps, flex 500 can be mechanically separated from fixture 506. Audio jack 510 can include attachment points 512 for attaching a substantially flat surface of flex 500 to audio jack 510. In some embodiments, flex 500 can electrically connect one attachment point 512 to another attachment point 512. In other embodiments, attachment points 512 can provide a mechanical connection between audio jack 510 and flex 500. Attachment points 512 can be contacts or solder points.

Figure 6:
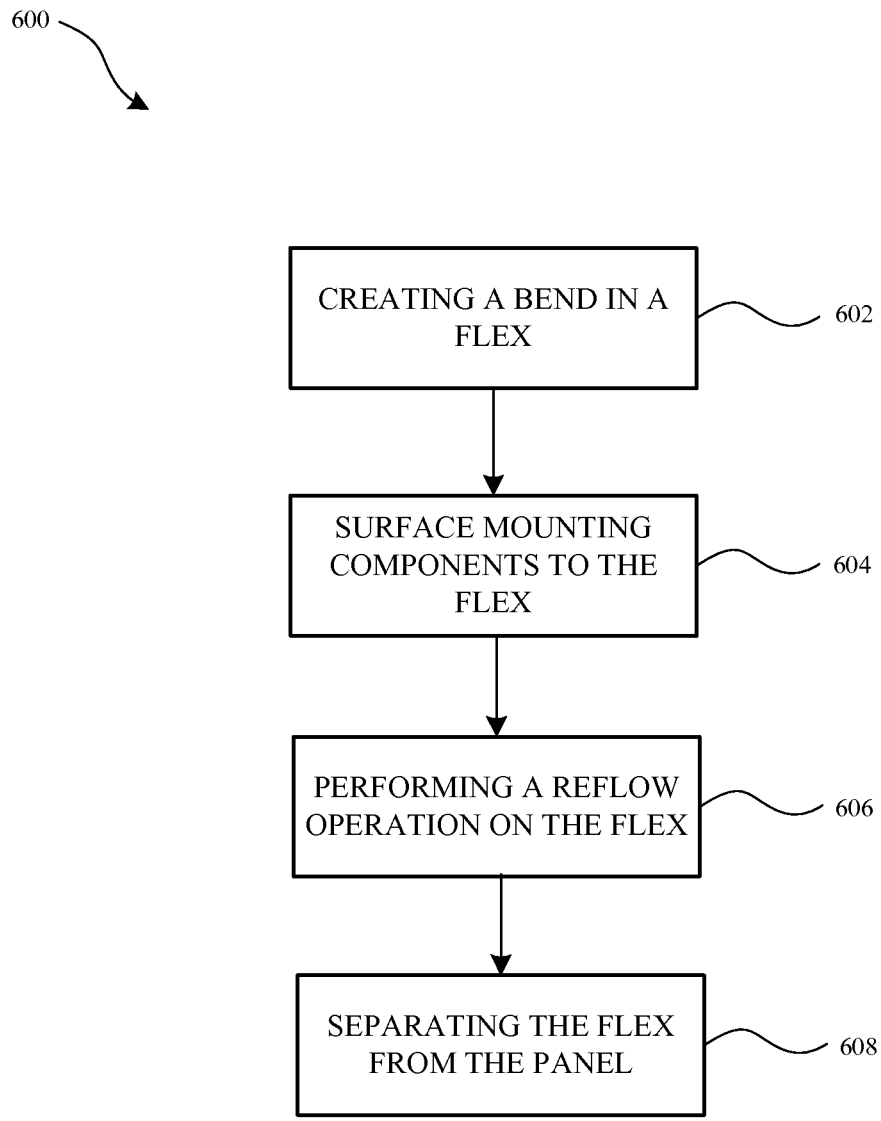
FIG. 6 shows a flow chart depicted a manufacturing method during which a flex can maintain a bent state during a surface mounting operation and a reflow operation.

FIG. 6 shows a flowchart depicting a manufacturing method 600 for creating an electronic device assembly. Step 602 includes creating a bend in a portion of a flexible circuit (flex). The flex can be attached to paneling formed of a rigid material. In some embodiments, the flex can be connected to the rigid material at particular points in order to facilitate easy separation of the flex from the paneling. A central portion of the paneling can be removed, which allows separated portions of the paneling to be manipulated in a way that arranges the flex into a stable bent state. Step 604 includes surface mounting components to the flex. In some embodiments, one of the components can be an audio jack assembly. The bend in the flex can conform to a protruding feature of the audio jack assembly. Step 606 includes performing a reflow operation on the flex and surface mounted components to form a soldered connection between the flex and the surface mounted components. Step 608 includes removing the paneling from the flex.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A mobile device, comprising:
a housing that defines an internal volume;
an audio component disposed within the internal volume and coupled to the housing, the audio component comprising a protruding feature positioned between a first lead and a second lead;
a flexible circuit, comprising:
   a first surface, comprising a first region soldered to the first lead, a second region soldered to the second lead and a central region disposed between the first and second regions that has a curved geometry that conforms to the protruding feature of the electrical component,
   a plurality of surface mounted components soldered to a second surface of the flexible circuit and separated by the protruding feature, the second surface being opposite the first surface, and
traces routed across the central region and electrically connecting the plurality of surface mounted components in support of an output function of the audio component, the central region providing the shortest path for connecting the surface mounted components.

2. The mobile device of claim 1, wherein the audio component is an audio jack that comprises a monolithic audio jack housing comprising the first region and the second region.

3. The mobile device of claim 2, wherein the audio component comprises:
a first modular connector component comprising the first lead;
a second modular connector component comprising the second lead; and
a support structure that interlocks with the first and second modular components, a central portion of the support structure being integrally formed with an audio jack barrel, wherein the audio jack barrel comprises the protruding feature.

4. The mobile device of claim 3, wherein the first and second modular connector components include circuitry for supporting an audio output function of the audio component.

5. The mobile device of claim 4, wherein at least one of the first modular connector component or the second modular connector component interacts with the plurality of surface mounted components to support the audio output function.

6. The mobile device of claim 3, wherein the support structure defines a plurality of channels each having a size and shape suitable for receiving a portion of the modular connector components.

7. The mobile device claim 3, wherein the first modular connector component comprises pins that are electrically coupled with contacts disposed within the support structure.

8. The mobile device of claim 3, wherein the audio jack barrel and the curved geometry of the flexible circuit are coaxially aligned.

9. The mobile device of claim 1, wherein a trace electrically couples a first one of the plurality of surface mounted components to a second one of the plurality of surface mounted components, and wherein a portion of the trace is disposed on the curved geometry of the central region.

10. The mobile device of claim 1, wherein the first one of the plurality of surface mounted components is located proximate the first region and the second one of the plurality of surface mounted components is located proximate the second region.

11. The mobile device of claim 1, wherein the central region comprises a gap that facilitates the ability of the flexible circuit to maintain its curved geometry and conform to the protruding portion of the audio component.

12. The mobile device of claim 1, wherein routing the traces through the central region includes providing the shortest path between respective surface mounted components taking into account the gap of the central region.

* * * * *